(12) United States Patent
Cadigan et al.

(10) Patent No.: US 9,753,076 B2
(45) Date of Patent: Sep. 5, 2017

(54) VOLTAGE RAIL MONITORING TO DETECT ELECTROMIGRATION

(71) Applicant: International Business Machines Corporation, Armonk, NY (US)

(72) Inventors: David D. Cadigan, Poughkeepsie, NY (US); William V. Huott, Holmes, NY (US); Adam J. McPadden, Underhill, VT (US); Anuwat Saetow, Austin, TX (US); Gary A. Tressler, Sandy Hook, CT (US)

(73) Assignee: International Business Machines Corporation, Armonk, NY (US)

( * ) Notice: Subject to any disclaimer, the term of this patent is extended or adjusted under 35 U.S.C. 154(b) by 25 days.

(21) Appl. No.: 15/008,802

(22) Filed: Jan. 28, 2016

(65) Prior Publication Data

US 2017/0219645 A1    Aug. 3, 2017

(51) Int. Cl.
   *G01R 31/02* (2006.01)
   *H01H 31/12* (2006.01)
   *G01R 31/08* (2006.01)
   *G01R 27/08* (2006.01)
   *G01R 31/28* (2006.01)

(52) U.S. Cl.
   CPC ......... *G01R 31/025* (2013.01); *G01R 31/024* (2013.01); *G01R 31/2851* (2013.01); *G01R 31/2858* (2013.01)

(58) Field of Classification Search
   CPC   G01R 31/025; G01R 31/024; G01R 31/2851; G01R 31/2858
   USPC ................................. 324/537, 551, 522, 713
   See application file for complete search history.

(56) References Cited

U.S. PATENT DOCUMENTS

| | | | |
|---|---|---|---|
| 5,162,742 | A | 11/1992 | Atkins et al. |
| 5,294,883 | A | 3/1994 | Akiki et al. |
| 5,909,348 | A | 6/1999 | Zydek et al. |
| 6,385,547 | B1 | 5/2002 | Bogli |
| 6,466,038 | B1 | 10/2002 | Pekin et al. |

(Continued)

FOREIGN PATENT DOCUMENTS

CN            201984136 U        9/2011

OTHER PUBLICATIONS

List of IBM Patents or Patent Applications Treated as Related, Oct. 5, 2016, pp. 1-2.

(Continued)

*Primary Examiner* — Amy He
(74) *Attorney, Agent, or Firm* — Law Office of Jim Boice

(57) ABSTRACT

An integrated circuit is configured to detect current leakage that results from electromigration in the integrated circuit. An isolation power switch selectively connects a target voltage rail in the integrated circuit to a power source. A voltage memory stores a record of an initial voltage decay rate for the target voltage rail while isolated from a manufacturer's power source. A voltage record comparator logic compares the initial voltage decay rate to a field voltage decay rate for the target voltage rail when isolated from a field power source. An output device indicates that a difference between the initial voltage decay rate and the field voltage decay rate for the target voltage rail exceeds a predefined limit, where the difference is a result of current leakage caused by electromigration in the integrated circuit.

20 Claims, 6 Drawing Sheets

(56) References Cited

U.S. PATENT DOCUMENTS

| | | |
|---|---|---|
| 6,483,341 B2 | 11/2002 | Gauthier et al. |
| 6,784,000 B2 | 8/2004 | Sikora et al. |
| 6,858,450 B1 | 2/2005 | Doan et al. |
| 7,304,485 B2 | 12/2007 | Cappelletti et al. |
| 7,340,437 B2 | 3/2008 | Aberle et al. |
| 7,501,830 B2 | 3/2009 | Kumar |
| 7,619,864 B1 | 11/2009 | Huang |
| 7,889,011 B2 | 2/2011 | Nyboe et al. |
| 8,086,980 B2 | 12/2011 | Vogel |
| 8,781,764 B2 | 7/2014 | Singh |
| 8,836,365 B2 | 9/2014 | Wang et al. |
| 2004/0183561 A1* | 9/2004 | Takekoshi ............ G01R 1/0433 324/750.03 |
| 2006/0125494 A1 | 6/2006 | Von Hagen |
| 2011/0148429 A1 | 6/2011 | Minemier |
| 2012/0062268 A1* | 3/2012 | Chevallier .............. H01L 22/34 324/762.01 |
| 2013/0307556 A1 | 11/2013 | Ledenev et al. |

OTHER PUBLICATIONS

U.S. Appl. No. 15/054,464 Non-Final Office Action dated May 5, 2017.

* cited by examiner

VOLTAGE RAIL MONITORING TO DETECT ELECTROMIGRATION

BACKGROUND

The present disclosure relates to the field of electronic circuits, and specifically to electronic circuits that are vulnerable to electromigration.

Electromigration is the movement of conductive materials caused by a transfer of momentum between electrons and ions in the conductive material. The displaced conductive material can cause one or more conductive tendrils to form. Given a first conductor in close proximity to a second conductor, over time a conductive tendril may form between the first and second conductor.

SUMMARY

In an embodiment of the present invention, an integrated circuit is configured to detect current leakage that results from electromigration in the integrated circuit. A target voltage rail provides power to at least one circuit node in the integrated circuit. An isolation power switch selectively connects the target voltage rail to a power source. A voltage sensor couples the target voltage rail to a reference voltage source. A memory supervisor is coupled to the voltage sensor. A voltage memory, which is coupled to the memory supervisor, stores a record of an initial voltage decay rate for the target voltage rail while isolated from a manufacturer's power source. A clock, which is coupled to the memory supervisor, triggers the memory supervisor to take serial voltage readings from the voltage sensor while the target voltage rail is isolated from a field power source to create a field voltage decay rate for the target voltage rail. A voltage record comparator logic compares the initial voltage decay rate to the field voltage decay rate for the target voltage rail. An output device, which is coupled to the voltage record comparator logic, indicates that a difference between the initial voltage decay rate and the field voltage decay rate for the target voltage rail exceeds a predefined limit, where the difference between the initial voltage decay rate and the field voltage decay rate for the target voltage rail is a result of current leakage caused by electromigration in the integrated circuit.

In an embodiment of the present invention, the integrated circuit just described is a component of a field replaceable board in an electronic device.

In an embodiment of the present invention, a computer program product detects electromigration in a field replaceable unit. The computer program product includes a non-transitory computer readable storage medium having program code embodied therewith. The program code is readable and executable by a processor to perform a method of: quiescenting an integrated circuit that is within a field replaceable unit (FRU), wherein the FRU is a field replaceable board in an electronic device; applying, via an isolation power switch, a test voltage from a field power source to a target voltage rail in the integrated circuit, where the test voltage is below an operational voltage for transistors within the integrated circuit; isolating, via the isolation power switch, the target voltage rail from the field power source; measuring, by a voltage sensor coupled to the target voltage rail, a field voltage decay rate for the target voltage rail, where the voltage sensor couples the target voltage rail to a reference voltage source; comparing, via a voltage record comparator logic within the integrated circuit, the field voltage decay rate to an initial voltage decay rate for the target voltage rail; and in response to a difference between the field voltage decay rate and the initial voltage decay rate for the target voltage rail exceeding a predetermined limit, sending a signal to an alarm on the FRU, where the difference between the initial voltage decay rate and the field voltage decay rate for the target voltage rail is a result of current leakage caused by electromigration in the integrated circuit.

DETAILED DESCRIPTION

Figure 1:
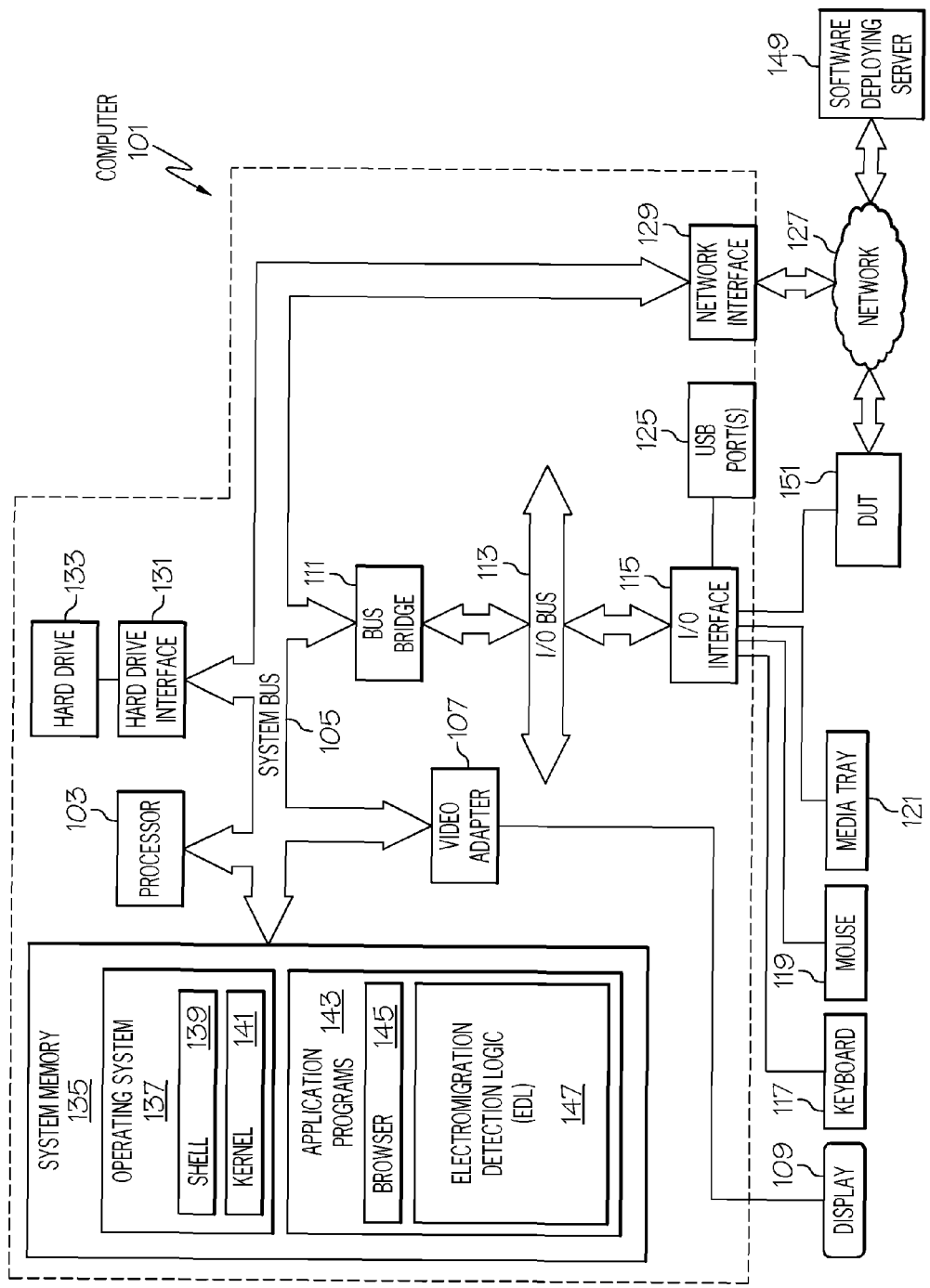
FIG. 1 depicts an exemplary system and network in which the present disclosure may be implemented.

The present invention may be utilize a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Electromigration (EM) is the redistribution of material over time in current carrying paths (chip traces, ball grid arrays, laminate traces, etc.) common to the semiconductor industry. This is a slow process that can cause functional failure due to voids (where material was removed) or shorts (where material was deposited).

Previously, detection of resistive growths has relied on the occurrence of failures. The present invention, however, monitors growing tendrils affecting voltage rails before a fatal short develops. That is, the present invention identifies defects which exist at Time Zero (T0) that are not severe enough to (a) cause a functional impact or (b) even be detected by prior art test methods.

Thus, the present invention provides a mechanism to detect EM induced growing resistive shorts affecting voltage rails over time in the field before they cause a functional failure for a customer/user.

The present invention is capable of detecting other types of time-dependent defect leakage mechanisms beyond EMs, should they occur. That is, the present invention can be used to detect any type of defect in a circuit, assuming that such defects result in an anomalous voltage decay in an isolated voltage rail in the circuit.

In one or more embodiments, firmware integration enables the system to control workloads to a chip under test with minimal system impact by providing a mechanism to measure the voltage discharge rate (voltage sense) as a detector of resistive shorts affecting voltage rails and other structures. This allows the system to compare measurements to time zero readings in order to determine effects over time.

With reference now to the figures, and in particular to FIG. 1, there is depicted a block diagram of an exemplary system and network that may be utilized by and/or in the implementation of the present invention. Some or all of the exemplary architecture, including both depicted hardware and software, shown for and within computer 101 may be utilized by software deploying server 149 and/or the device under test (DUT) 151 (e.g., the field replaceable unit (FRU) 204) shown in FIG. 1).

Exemplary computer 101 includes a processor 103 that is coupled to a system bus 105. Processor 103 may utilize one or more processors, each of which has one or more processor cores. A video adapter 107, which drives/supports a display 109, is also coupled to system bus 105. System bus 105 is coupled via a bus bridge 111 to an input/output (I/O) bus 113. An I/O interface 115 is coupled to I/O bus 113. I/O interface 115 affords communication with various I/O devices, including a keyboard 117, a mouse 119, a media tray 121 (which may include storage devices such as CD-ROM drives, multi-media interfaces, etc.), and external USB port(s) 125. While the format of the ports connected to I/O interface 115 may be any known to those skilled in the art of computer architecture, in one embodiment some or all of these ports are universal serial bus (USB) ports.

As depicted, computer 101 is able to communicate with a software deploying server 149 and/or the DUT 151 using a network interface 129. Network interface 129 is a hardware network interface, such as a network interface card (NIC), etc. Network 127 may be an external network such as the Internet, or an internal network such as an Ethernet or a virtual private network (VPN). In one or more embodiments, network 127 is a wireless network, such as a Wi-Fi network, a cellular network, a dedicated radio-frequency (RF) network, a near-field communication (NFC) channel, etc.

A hard drive interface 131 is also coupled to system bus 105. Hard drive interface 131 interfaces with a hard drive 133. In one embodiment, hard drive 133 populates a system memory 135, which is also coupled to system bus 105. System memory is defined as a lowest level of volatile memory in computer 101. This volatile memory includes additional higher levels of volatile memory (not shown), including, but not limited to, cache memory, registers and buffers. Data that populates system memory 135 includes computer 101's operating system (OS) 137 and application programs 143.

OS 137 includes a shell 139, for providing transparent user access to resources such as application programs 143. Generally, shell 139 is a program that provides an interpreter and an interface between the user and the operating system. More specifically, shell 139 executes commands that are entered into a command line user interface or from a file. Thus, shell 139, also called a command processor, is generally the highest level of the operating system software hierarchy and serves as a command interpreter. The shell provides a system prompt, interprets commands entered by keyboard, mouse, or other user input media, and sends the interpreted command(s) to the appropriate lower levels of the operating system (e.g., a kernel 141) for processing. While shell 139 is a text-based, line-oriented user interface, the present invention will equally well support other user interface modes, such as graphical, voice, gestural, etc.

As depicted, OS 137 also includes kernel 141, which includes lower levels of functionality for OS 137, including providing essential services required by other parts of OS 137 and application programs 143, including memory management, process and task management, disk management, and mouse and keyboard management.

Application programs 143 include a renderer, shown in exemplary manner as a browser 145. Browser 145 includes program modules and instructions enabling a world wide web (WWW) client (i.e., computer 101) to send and receive network messages to the Internet using hypertext transfer protocol (HTTP) messaging, thus enabling communication with software deploying server 149 and other systems.

Application programs 143 in computer 101's system memory (as well as software deploying server 149's system memory) also include an Electromigration Detection Logic (EDL) 147. EDL 147 includes code for implementing the processes described below, including those described in FIGS. 2-6. In one embodiment, computer 101 is able to download EDL 147 from software deploying server 149, including in an on-demand basis, wherein the code in EDL 147 is not downloaded until needed for execution. In one embodiment of the present invention, software deploying server 149 performs all of the functions associated with the present invention (including execution of EDL 147), thus freeing computer 101 from having to use its own internal computing resources to execute EDL 147.

The hardware elements depicted in computer 101 are not intended to be exhaustive, but rather are representative to highlight essential components required by the present invention. For instance, computer 101 may include alternate memory storage devices such as magnetic cassettes, digital versatile disks (DVDs), Bernoulli cartridges, and the like. These and other variations are intended to be within the spirit and scope of the present invention.

Figure 2:
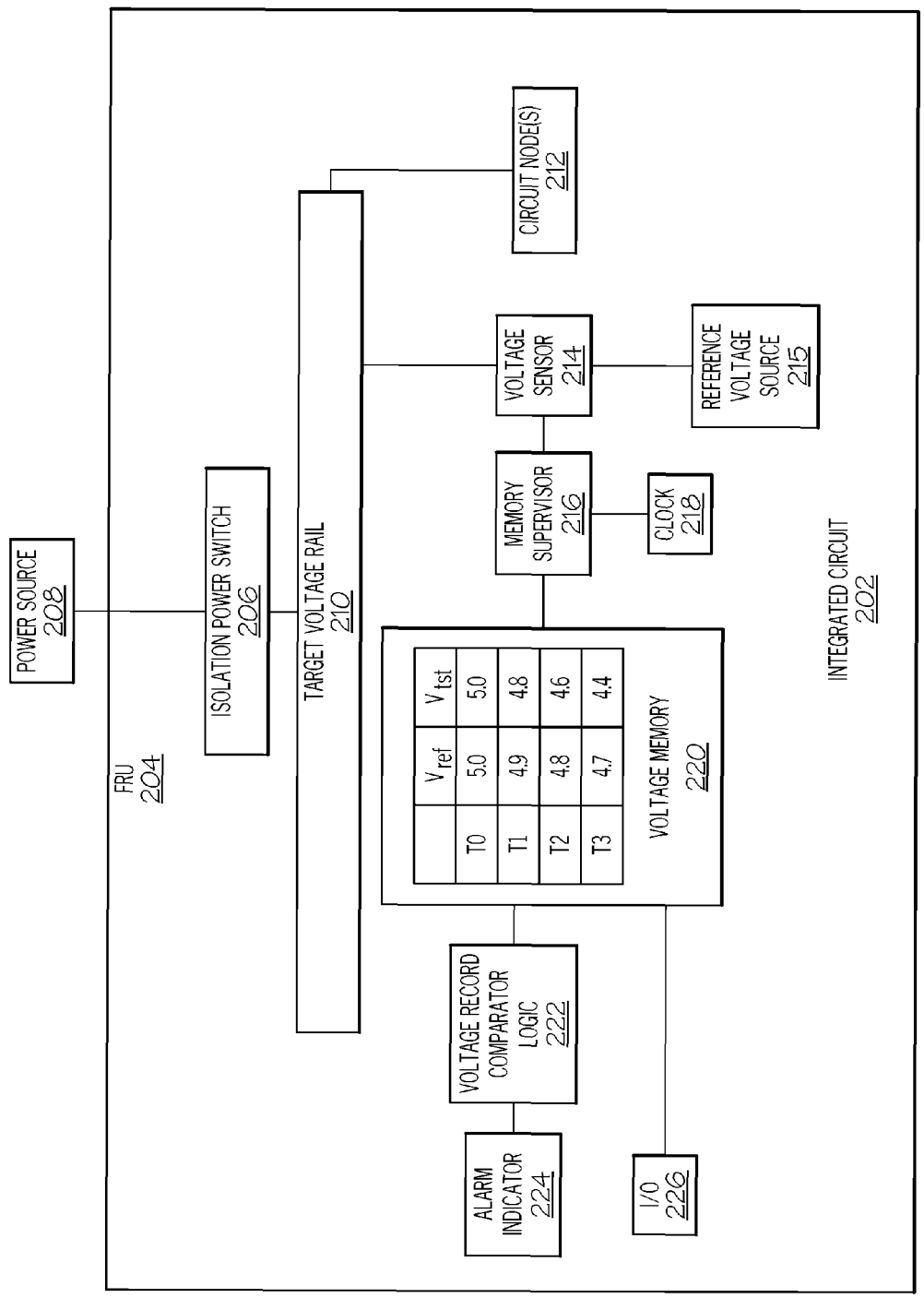
FIG. 2 illustrates an exemplary integrated circuit in a field replaceable unit (FRU) in accordance with one or more embodiments of the present invention.

With reference now to FIG. 2, an exemplary integrated circuit (IC) 202 within a field replaceable unit (FRU) 204 is presented in accordance with one or more embodiments of the present invention. As suggested by the name, FRU 204 is a circuit board that is easily replaceable in the field using few if any tools. FRU 204 may be part of a computer system or any other electronic device, such as a controller for manufacturing equipment, etc.

As shown in FIG. 2, IC 202 has an isolation power switch 206, which electrically couples a power source 208 to a target voltage rail 210. Target voltage rail 210 provides electrical voltage to one or more circuit node(s) 212, such as execution units, memory devices, controllers, etc.

Within IC 202 is a voltage sensor 214, which measures the amount of voltage on the target voltage rail 210 as compared to a reference voltage source 215. In various embodiments of the present invention, the reference voltage source 215 is a ground, a negatively biased voltage source (e.g., another voltage rail, not shown, that increases a voltage potential of the target voltage rail 210), or a positively biased voltage source (e.g., another voltage rail, not shown, that reduces the voltage potential of the target voltage rail 210). Thus, a negatively biased voltage source will induce voltage decay in the target voltage rail 210 when isolated from power source 208 and while circuit node(s) 212 are quiesced, and a positively biased voltage source will impede voltage decay in the target voltage rail 210 when isolated from power source 208 and while circuit node(s) 212 are quiesced.

A memory supervisor 216 takes periodic (e.g., under the control of a clock 218) voltage measurements from the voltage sensor 214 and stores them in a voltage memory 220. These voltage measurements are taken 1) at the time the IC 202 is manufactured and/or installed on the FRU 204 as well as 2) while the IC 202/FRU 204 are in the field (i.e., are part of an operational system).

That is, when the IC 202 was manufactured, a baseline for voltage decay of the target voltage rail 210 when isolated from a power source is measured by the voltage sensor 214. As shown in exemplary purposes, this voltage has a linear decay of $0.1V_{DC}$ every time unit. For example, as shown in FIG. 2 assume that when the IC 202 was manufactured, the target voltage rail 210 was 1) connected by isolation power switch 206 (i.e., isolation power switch 206 is closed) to a power source (not shown) at the manufacturer's facility, which put $5V_{DC}$ onto the target voltage rail 210, and 2) was then isolated from that power source by isolation power switch 206 (i.e., isolation power switch 206 is opened). The voltage decay on the target voltage rail 210 at the time of manufacture thus went from $5.0V_{DC}$ at time T0, down to $4.9V_{DC}$ at time T1, down to $4.8V_{DC}$ at time T2, and then down to $4.7V_{DC}$ at time T3, as shown in the column for the reference voltage readings $V_{ref}$. Assume further that this voltage decay is normal for IC 202.

Assume now that, while in the field (i.e., in the environment of a system in which the FRU 204 is installed), that the target voltage rail 210 was 1) connected by isolation power switch 206 (i.e., isolation power switch 206 is closed) to a field power source 208 while installed in the computer system, which also put $5V_{DC}$ onto the target voltage rail 210, and 2) was then isolated from that power source by isolation power switch 206 (i.e., isolation power switch 206 is opened). The voltage decay on the target voltage rail 210 while the FRU is installed in the computer system thus went from $5.0V_{DC}$ at time T0, down to $4.8V_{DC}$ at time T1, down to $4.6V_{DC}$ at time T2, and then down to $4.4V_{DC}$ at time T3, as shown in the column for the present field test voltage readings $V_{tst}$.

Figure 3:
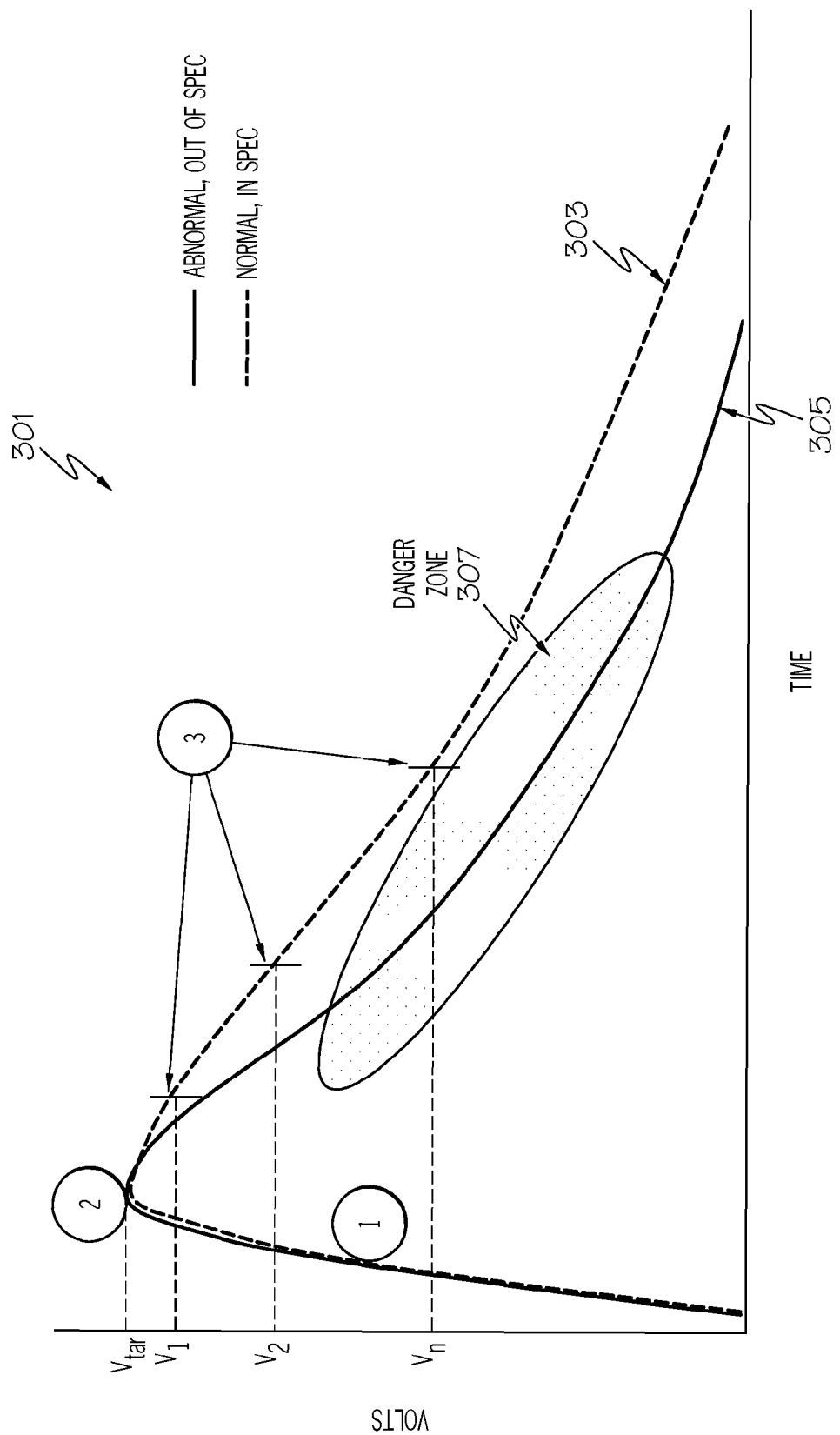
FIG. 3 depicts exemplary charging and discharging rate curves for a target voltage rail with and without defects in the integrated circuit shown in FIG. 2.

As shown in graph 301 in FIG. 3, this difference in voltage decay has a specific shape based on electromigration. That is, in both the manufacturing facility that built the IC 202 and in the field, the target voltage rail 210 has $5.0V_{DC}$ applied by a power source (step 1). In both the manufacturing facility that built the IC 202 and in the field, the target voltage rail 210 is isolated from the power source (step 2). The voltage on the target voltage rail 210 then decays (step 3).

As shown in graph 301, the voltage decay of the target voltage rail 210 when the IC 202 was manufactured has a normal (e.g., linear) decay rate, as depicted by line 303. However, in the field, the voltage decay of the target voltage rail 210 is much more pronounced, as depicted by line 305, thus taking the IC 202 into a "danger zone" 307. That is, the danger zone is indicative of electromigration causing conductive tendrils of metal to leak voltage/current, as determined by modeling, prior tests, etc. In this example the conductive tendril causes the decay rate to increase. However if the tendril had contacted a voltage that was higher than the target voltage rail 210, the decay rate could decrease, which is also indicative of an increasingly conductive leakage path.

Returning to FIG. 2, a voltage record comparator logic 222 compares the values in voltage memory 220 for $V_{ref\ to}$ $V_{tst}$. If the value(s) differences exceed a predefined value (e.g., a difference between $V_{ref\ to}$ $V_{tst}$ of more than $0.1V_{DC}$ at one or more time periods after time T0), then an alarm indicator 224 (e.g., a register bit which firmware polls, a LED or some other early warning mechanism) will be activated. Alternatively, a test computer (e.g., computer 101 shown in FIG. 1) can plug into input/output (I/O) 226 and retrieve readings directly (or indirectly via voltage record comparator logic 222) from voltage memory 220.

Note that voltage record comparator logic 222 and voltage sensor 214 are circuits that preferably are part of IC 202. Thus, in a preferred embodiment voltage record comparator logic 222 and voltage sensor 214 utilize minimum components that are able to be formed on IC 202 using photo etching, conductor spattering, etc.

Figure 4:
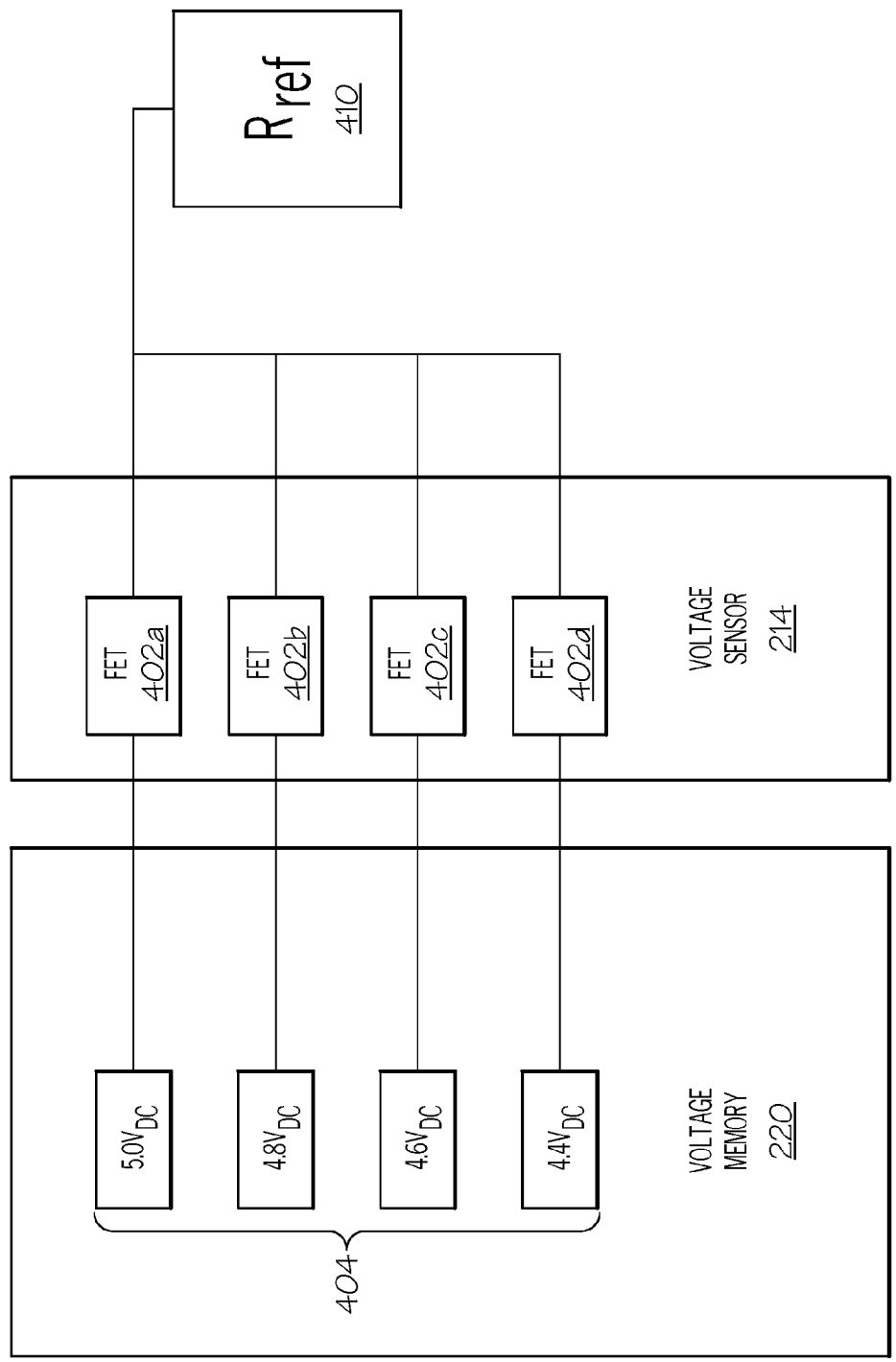
FIG. 4 illustrates an exemplary voltage monitor as used in accordance with one or more embodiments of the present invention to monitor voltage decay in the target voltage rail depicted in FIG. 2.

For example, consider exemplary voltage sensor 214 shown in FIG. 4. In this example, voltage sensor 214 has several transistors, depicted as field effect transistors (FETs) 402a-402d, each of which have a voltage bias for a different voltage level before they are turned on. That is, assume that a reference resistance $R_{ref}$ 410, which may be a delimiting resistor connected to target voltage rail 210 or may be target voltage rail 210 itself, is being monitored by voltage sensor 214. Assume further that, due to voltage biasing, FET 402a turns on when exposed to $5.0V_{DC}$, and that FET 402b turns on when exposed to $4.8V_{DC}$, and that FET 402c turns on when exposed to $4.6V_{DC}$, and that FET 402b turns on when exposed to $4.4V_{DC}$. The voltage memory 220, using dedicated ports and/or other circuitry, loads these voltage values into the memory array 404, as shown in FIG. 4. That is, when each cell in the memory array 404 is turned on by one of the FETs 402a-402d, a preset value is loaded onto that cell.

Similarly, voltage record comparator logic 222 may be implemented as a circuit etched/plated on IC 202. For example, voltage record comparator logic 222 may be implemented as transistors that are arranged to turn off and on depending on the differences in values in voltage memory 220. For example, if the $V_{ref}$ at T2 is $4.8V_{DC}$ and the $V_{tst}$ at T2 is $4.6V_{DC}$, XOR chips (e.g., part of voltage record comparator logic 222) can output a signal indicating that the one or more bits in the byte that describes two values are different, thus indicating tendril current leakage caused by electromigration.

Thus, the present invention does not require probes or other testing devices such as that used in an Iddq test or similar system, but rather uses just a few electronic components that preferably are part of the IC 202 itself.

As just mentioned, in one embodiment, the voltage sensor 214 and/or voltage record comparator logic 222 are preferably part of IC 202. Similarly and in another embodiment, the isolation power switch 206, memory supervisor 216, clock 218, voltage memory 220, alarm indicator 224, and/or I/O 226 are part of the integrated circuit 202 as depicted in FIG. 2. In an alternative embodiment, one or more of the isolation power switch 206, memory supervisor 216, clock 218, voltage memory 220, voltage record comparator logic 222, alarm indicator 224, and/or I/O 226 are mounted on a circuit board (not depicted), which is part of the FRU 204. However, in one embodiment, target voltage rail 210 and circuit node(s) 212 are only part of IC 202.

Thus, in an embodiment of the present invention depicted in FIG. 2, an IC 202, which may incorporated into an FRU 204, is presented. The target voltage rail 210 provides power to at least one circuit node from the circuit node(s) 212 in the IC 202. The isolation power switch 206 selectively connects the target voltage rail 210 to a power source 208, which may be a manufacturer's power source or a field power source, as described above.

A voltage sensor 214 couples the target voltage rail 210 to a reference voltage source 215, which may be ground or a biased source (e.g., a biased other voltage rail, either on the IC 202 or on the FRU 204). A memory supervisor 216, which is coupled to the voltage sensor 214, is coupled to a voltage memory 220, which stores a record of an initial voltage decay rate ($V_{ref}$) for the target voltage rail 210 while isolated from a manufacturer's power source (e.g., a first embodiment of power source 208) and while circuits (e.g., circuit node(s) 212) on the IC 202 are quiesced. A clock 218, which is coupled to the memory supervisor 216, triggers the memory supervisor 216 to take serial voltage readings from the voltage sensor 214 while the target voltage rail 210 is isolated from a field power source (e.g., power source 208) to create a field voltage decay rate for the target voltage rail 210.

A voltage record comparator logic 222 compares the initial voltage decay rate to the field voltage decay rate for the target voltage rail 210. The voltage record comparator logic 222 may be implemented in software and/or firmware using processing components (not depicted) on IC 202, or voltage record comparator logic 222 may be hardware as described above.

An output device (alarm indicator 224 and/or I/O 226), which is coupled to the voltage record comparator logic 222, describes a difference between the initial voltage decay rate and the field voltage decay rate for the target voltage rail that exceeds a predefined limit. As described herein, the difference between the initial voltage decay rate and the field voltage decay rate for the target voltage rail is a result of current leakage in the integrated circuit. In a preferred embodiment, the level and/or specific pattern of difference is predetermined (based on previous tests) to indicate that the current leakage is caused by the presence of electromigration on the IC 202.

Figure 5:
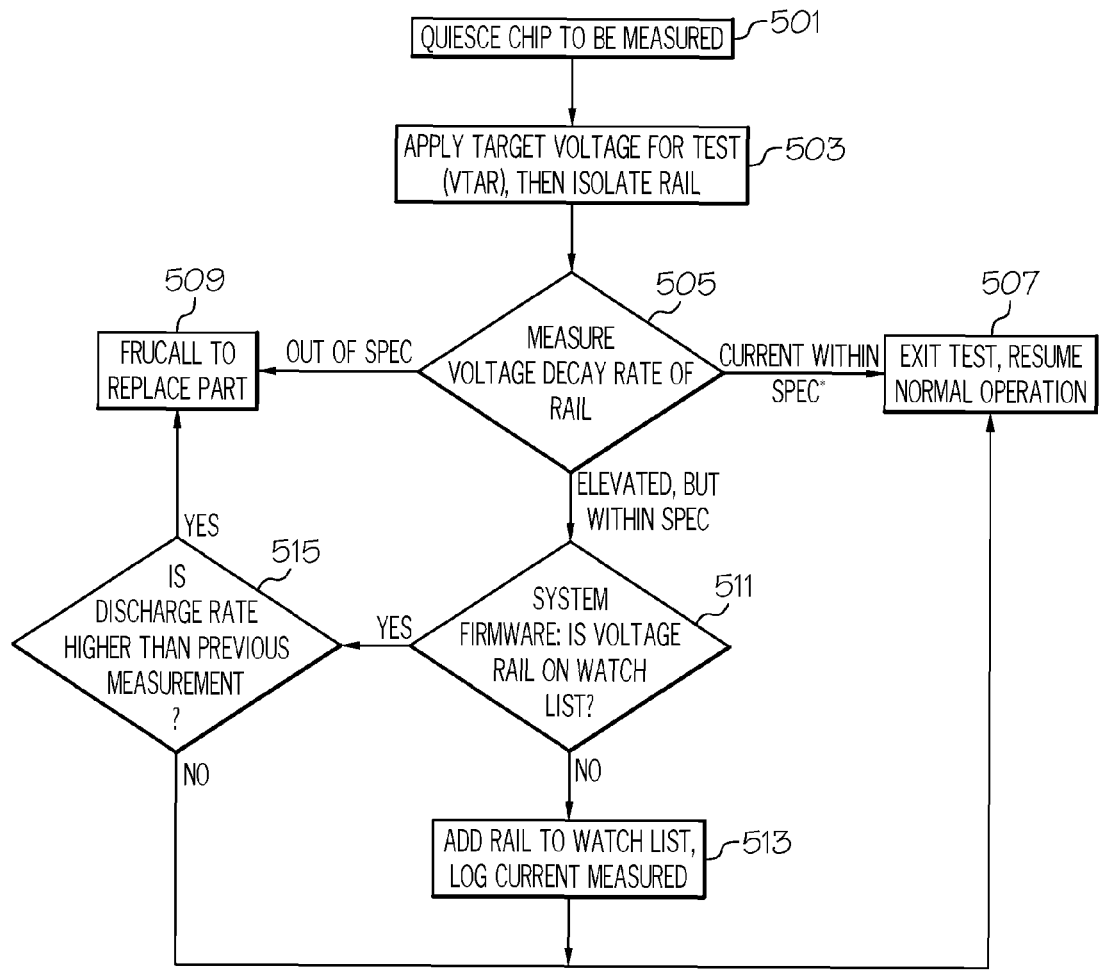
FIG. 5 is a high level flow chart of one or more steps performed by one or more processors and/or other hardware devices to test and respond to a field replaceable unit exhibiting electromigration in accordance with a first embodiment of the present invention.

With reference now to FIG. 5, a high level flow chart of one or more steps performed by one or more processors and/or other hardware devices to test and respond to a field replaceable unit exhibiting electromigration in accordance with a first embodiment of the present invention is presented. As shown in block 501, the IC 202 to be tested for electromigration-based leakage, is quieted/quiesced (e.g., circuit node(s) 212 are allowed to "settle down", such that no transistors are active, no power is being drawn, etc.)

As shown in block 503, a target voltage (e.g., $5.0V_{DC}$) is applied to the target voltage rail 210 at a voltage (i.e., $V_{tar}$) that will not excite the nodes in the IC 202 (i.e., $V_{tar}$ is less than the voltage that will cause the circuit node(s) 212 to become active).

As shown in block 505, a determination is made as to whether or not the voltage decay on the target voltage rail 210 is out of spec, within spec, or within spec but nonetheless elevated. If the voltage decay is within spec (i.e., is close to the nominal voltage decay rate displayed by the target voltage rail 210 when it was manufactured), then the process ends (block 507). If the voltage decay is out of spec (i.e., varies beyond some predefined limit from the voltage decay for target voltage rail 210 when it was manufactured), then a field replaceable unit call ("frucall") is issued to replace the FRU 204. If the voltage decay rate is elevated but still within spec, then a query is made as to whether or not the target voltage rail is on a watch list (query block 511), as identified by system firmware. This watch list may be the result of the IC 202 being tested showing elevated levels of voltage decay in prior tests, other ICs from the same batch as IC 202 demonstrating electromigration problems, IC 202 being used by mission critical systems, etc. If IC 202 is showing a trend of worsening voltage decay from target voltage rail 210 (query block 515), then the system will issue an instruction to replace the FRU 204. If this is the first time that the IC 202 has shown an elevated, but not out of spec, voltage decay rate, then it is added to the watch list (block 513), and operations resume.

Figure 6:
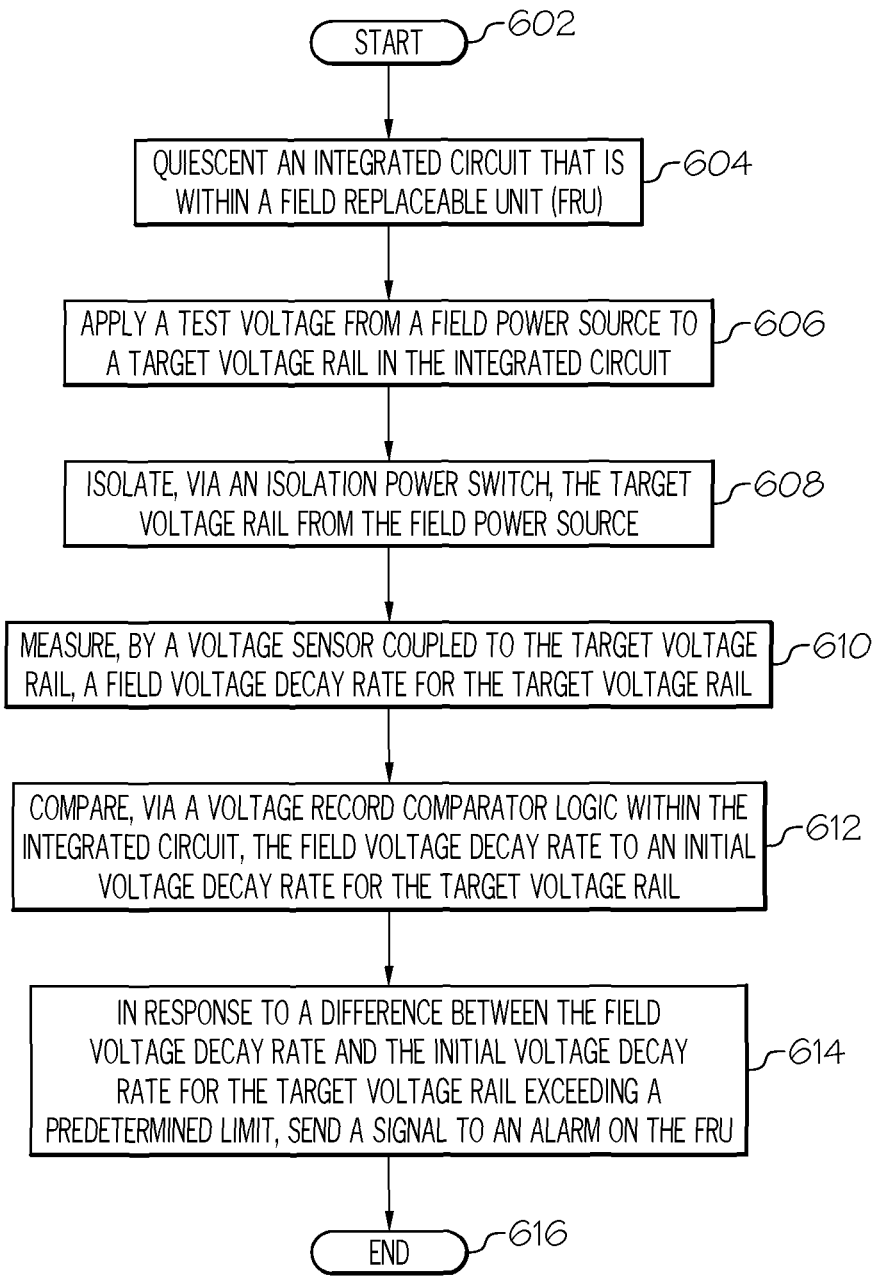
FIG. 6 is a high level flow chart of one or more steps performed by one or more processors and/or other hardware devices to test and respond to a field replaceable unit exhibiting electromigration in accordance with a second embodiment of the present invention.

With reference now to FIG. 6, a high level flow chart of one or more steps performed by one or more processors and/or other hardware devices to test and respond to a field replaceable unit exhibiting electromigration in accordance with a second embodiment of the present invention is presented.

After initiator block 602, one or more processors quiescent an integrated circuit that is within a field replaceable unit (FRU), where the FRU is a field replaceable board in an electronic device, as described in block 604.

As described in block 606, one or more processors apply, via an isolation power switch, a test voltage from a field power source to a target voltage rail in the integrated circuit, where the test voltage is below an operational voltage for transistors within the integrated circuit. That is, the rail voltage (to test of electromigration leakage) being applied to target voltage rail needs to be very low—less than an FET threshold voltage, and less than a "diode drop". FET and junction leakages go up rapidly with voltages, making small electromigration faults difficult to detect. Thus, in one or more embodiments of the present invention, reference/test voltages being applied to target voltage rail 210 are between 0.3 $V_{DC}$ and 0.2 $V_{DC}$, which is lower than an FET threshold and low enough to keep junction leakages low.

As described in block 608, an isolation power switch isolates the target voltage rail from the field power source.

As described in block 610, a voltage sensor coupled to the target voltage rail measures, along with a memory supervisor and a clock, a field voltage decay rate for the target voltage rail.

As described in block 612, a voltage record comparator logic within the integrated circuit compares the field voltage decay rate to an initial voltage decay rate for the target voltage rail.

As described in block 614, in response to a difference between the field voltage decay rate and the initial voltage decay rate for the target voltage rail exceeding a predetermined limit, the voltage record comparator logic sends a signal to an alarm on the FRU, where the difference between the initial voltage decay rate and the field voltage decay rate for the target voltage rail has been predetermined (e.g., by prior test results) to be a result of current leakage caused by electromigration in the integrated circuit.

The flow chart ends at terminator block 616.

As described herein, in one embodiment of the present invention the initial voltage decay rate was recorded upon an installation of the integrated circuit into the field replaceable unit (FRU).

As described herein, in one embodiment of the present invention the reference voltage source is a reference voltage rail that provides a bias voltage to the target voltage rail.

The terminology used herein is for the purpose of describing particular embodiments only and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of various embodiments of the present invention has been presented for purposes of illustration and description, but is not intended to be exhaustive or limited to the present invention in the form disclosed. Many modifications and variations will be apparent to those of ordinary skill in the art without departing from the scope and spirit of the present invention. The embodiment was chosen and described in order to best explain the principles of the present invention and the practical application, and to enable others of ordinary skill in the art to understand the present invention for various embodiments with various modifications as are suited to the particular use contemplated.

Any methods described in the present disclosure may be implemented through the use of a VHDL (VHSIC Hardware Description Language) program and a VHDL chip. VHDL is an exemplary design-entry language for Field Programmable Gate Arrays (FPGAs), Application Specific Integrated Circuits (ASICs), and other similar electronic devices. Thus, any software-implemented method described herein may be emulated by a hardware-based VHDL program, which is then applied to a VHDL chip, such as a FPGA.

Having thus described embodiments of the present invention of the present application in detail and by reference to illustrative embodiments thereof, it will be apparent that modifications and variations are possible without departing from the scope of the present invention defined in the appended claims.

What is claimed is:

1. An integrated circuit comprising:
a target voltage rail, wherein the target voltage rail provides power to at least one circuit node in the integrated circuit;
an isolation power switch, wherein the isolation power switch selectively connects the target voltage rail to a power source;
a voltage sensor that couples the target voltage rail to a reference voltage source;
a memory supervisor coupled to the voltage sensor;
a voltage memory coupled to the memory supervisor, wherein the voltage memory stores a record of an initial voltage decay rate for the target voltage rail while isolated from a manufacturer's power source;
a clock coupled to the memory supervisor, wherein the clock triggers the memory supervisor to take serial voltage readings from the voltage sensor while the target voltage rail is isolated from a field power source to create a field voltage decay rate for the target voltage rail;
a voltage record comparator logic, wherein the voltage record comparator logic compares the initial voltage decay rate to the field voltage decay rate for the target voltage rail; and
an output device coupled to the voltage record comparator logic, wherein the output device describes a difference between the initial voltage decay rate and the field voltage decay rate for the target voltage rail that exceeds a predefined limit, and wherein the difference between the initial voltage decay rate and the field voltage decay rate for the target voltage rail is a result of current leakage in the integrated circuit.

2. The integrated circuit of claim 1, wherein the current leakage is a result of electromigration in the integrated circuit.

3. The integrated circuit of claim 1, wherein the initial voltage decay rate was recorded upon a final manufacturing of the integrated circuit.

4. The integrated circuit of claim 1, wherein the initial voltage decay rate was recorded upon a final installation of the integrated circuit into a field replaceable unit (FRU), wherein the FRU is a field replaceable board for an electronic system.

5. The integrated circuit of claim 1, wherein the reference voltage source is a ground.

6. The integrated circuit of claim 1, wherein the reference voltage source is a reference voltage rail.

7. The integrated circuit of claim 6, wherein the reference voltage rail provides a bias voltage to the target voltage rail.

8. The integrated circuit of claim 1, wherein the output device is an input/output connector to a test device.

9. The integrated circuit of claim 1, wherein the output device is an alarm indicator.

10. A field replaceable unit (FRU), wherein the FRU is a field replaceable board for an electronic device, and wherein the FRU comprises:
an integrated circuit that comprises:
a target voltage rail, wherein the target voltage rail provides power to at least one circuit node in the integrated circuit;
an isolation power switch, wherein the isolation power switch selectively connects the target voltage rail to a power source;
a voltage sensor that couples the target voltage rail to a reference voltage source;
a memory supervisor coupled to the voltage sensor;
a voltage memory coupled to the memory supervisor, wherein the voltage memory stores a record of an initial voltage decay rate for the target voltage rail while isolated from a manufacturer's power source;
a clock coupled to the memory supervisor, wherein the clock triggers the memory supervisor to take serial voltage readings from the voltage sensor while the target voltage rail is isolated from a field power source to create a field voltage decay rate for the target voltage rail;
a voltage record comparator logic, wherein the voltage record comparator logic compares the initial voltage decay rate to the field voltage decay rate for the target voltage rail; and
an output device coupled to the voltage record comparator logic, wherein the output device indicates that a difference between the initial voltage decay rate and the field voltage decay rate for the target voltage rail exceeds a predefined limit, and wherein the difference between the initial voltage decay rate and the field voltage decay rate for the target voltage rail is a result of current leakage caused by electromigration in the integrated circuit.

11. The FRU of claim 10, wherein the initial voltage decay rate was recorded upon a final manufacturing of the integrated circuit.

12. The FRU of claim 10, wherein the initial voltage decay rate was recorded upon a final installation of the integrated circuit into the FRU.

13. The FRU of claim 10, wherein the reference voltage source is a ground.

14. The FRU of claim 10, wherein the reference voltage source is a reference voltage rail.

15. The FRU of claim 14, wherein the reference voltage rail provides a bias voltage to the target voltage rail.

16. The FRU of claim 10, wherein the output device is an input/output connector to a test device.

17. The FRU of claim 10, wherein the output device is an alarm indicator.

18. A computer program product for detecting electromigration in a field replaceable unit, the computer program product comprising a non-transitory computer readable storage medium having program code embodied therewith, the program code readable and executable by a processor to perform a method comprising:
quiescenting an integrated circuit that is within a field replaceable unit (FRU), wherein the FRU is a field replaceable board in an electronic device;

applying, via an isolation power switch, a test voltage from a field power source to a target voltage rail in the integrated circuit, wherein the test voltage is below an operational voltage for transistors within the integrated circuit;

isolating, via the isolation power switch, the target voltage rail from the field power source;

measuring, by a voltage sensor coupled to the target voltage rail, a field voltage decay rate for the target voltage rail, wherein the voltage sensor couples the target voltage rail to a reference voltage source;

comparing, via a voltage record comparator logic within the integrated circuit, the field voltage decay rate to an initial voltage decay rate for the target voltage rail; and in response to a difference between the field voltage decay rate and the initial voltage decay rate for the target voltage rail exceeding a predetermined limit, sending, via the voltage record comparator logic, a signal to an alarm on the FRU, wherein the difference between the initial voltage decay rate and the field voltage decay rate for the target voltage rail has been predetermined to be a result of current leakage caused by electromigration in the integrated circuit.

19. The computer program product of claim 18, wherein the initial voltage decay rate was recorded upon an installation of the integrated circuit into the field replaceable unit (FRU).

20. The computer program product of claim 18, wherein the reference voltage source is a reference voltage rail that provides a bias voltage to the target voltage rail.

\* \* \* \* \*